(12) United States Patent  
Tanigawa et al.

(10) Patent No.: US 7,656,014 B2  
(45) Date of Patent: Feb. 2, 2010

(54) SEMICONDUCTOR DEVICE AND METHOD FOR MANUFACTURING SAME

(75) Inventors: Yoshiyuki Tanigawa, Kiyose (JP); Tamaki Wada, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 270 days.

(21) Appl. No.: 11/779,801

(22) Filed: Jul. 18, 2007

(65) Prior Publication Data

US 2007/0257346 A1    Nov. 8, 2007

Related U.S. Application Data

(62) Division of application No. 11/256,960, filed on Oct. 25, 2005, now abandoned.

(30) Foreign Application Priority Data

Oct. 29, 2004  (JP) .............................. 2004-316026

(51) Int. Cl.  
*H01L 23/02* (2006.01)

(52) U.S. Cl. .................. 257/679; 257/678; 257/723; 257/E23.064; 257/E23.065; 257/E23.176; 361/736; 361/737; 439/68

(58) Field of Classification Search ............... 257/679, 257/678, E23.064, E23.065, E23.176; 361/736, 361/737  
See application file for complete search history.

(56) References Cited

U.S. PATENT DOCUMENTS

| D364,399 S | 11/1995 | Long |
|---|---|---|
| D368,267 S | 3/1996 | Rak et al. |
| D368,903 S | 4/1996 | Ohmori et al. |
| D369,156 S | 4/1996 | Ohmori et al. |
| D369,157 S | 4/1996 | Ohmori et al. |
| 5,822,190 A | 10/1998 | Iwasaki |
| 6,028,774 A | 2/2000 | Shin et al. |
| 6,410,355 B1 | 6/2002 | Wallace |
| 6,471,130 B2 | 10/2002 | Iwasaki |
| 6,632,997 B2 | 10/2003 | Hoffman et al. |
| 7,239,011 B2 * | 7/2007 | Wada et al. .................. 257/679 |
| 7,535,088 B2 * | 5/2009 | Ni et al. ...................... 257/679 |
| 2002/0190429 A1 | 12/2002 | Bolken |

FOREIGN PATENT DOCUMENTS

JP          2000-326668          11/2000

* cited by examiner

*Primary Examiner*—Jasmine J Clark  
(74) *Attorney, Agent, or Firm*—Miles & Stockbridge P.C.

(57) ABSTRACT

A process yield of a semiconductor device is enhanced. To that end, there is provided a semiconductor device comprising a substrate having a component mount face with semiconductor chips mounted thereon, the substrate being provided with a plurality of connection leads, and a cap made of resin, placed over the component mount face of the substrate so as to cover the same, the a cap having a first body part, and a second body part larger in thickness than the first body part. Because product information in the form of inscriptions is engraved on the top surface side of the second body part of the cap, the product information can be displayed without the use of an ink mark, it is possible to prevent occurrence of marking defects due to ink bleed, and so forth, thereby enhancing the process yield of a memory card (the semiconductor device).

14 Claims, 11 Drawing Sheets

SEMICONDUCTOR DEVICE AND METHOD FOR MANUFACTURING SAME

CROSS-REFERENCE TO RELATED APPLICATION

This application is a division of application Ser. No. 11/256,960 filed Oct. 25, 2005, now abandoned.

The present application claims priority from Japanese patent application No. 2004-316026 filed on Oct. 29, 2004, the content of which is hereby incorporated by reference into this application.

BACKGROUND OF THE INVENTION

The invention relates to a semiconductor device and a technology for manufacturing the same, and in particular, to a technology effective for application to a semiconductor memory card (hereinafter referred to merely as a memory card).

With a method for manufacturing a conventional molded card, and a conventional molded card backing, at least one among characters, numbers, marks, symbols, and patterns, for identification of the card, in a protruded or depressed state, is formed on the top surface or the back surface of a backing of the molded card formed by injection molding, (refer to, for example, Patent Document 1).

[Patent Document 1]

Japanese Unexamined Patent Publication No. 2000-326668 (FIG. 2)

SUMMARY OF THE INVENTION

A memory card, such as a multimedia card (by Sun Disk, U, S. A), an SD card (by Panasonic, Toshiba, Sun Disk), and so forth, is one of storages for storing information in a semiconductor memory chip incorporated therein. With the memory card, because information is caused to have access directly, and electrically to a nonvolatile memory formed on the semiconductor memory chip, write time as well as read time is shorter in comparison with other storages to the extent that no mechanical control is employed, and in addition, storage media are replaceable.

Further, since the memory card is in the shape of a relatively small size, and is light in weight, it is used primarily as an auxiliary storage of equipment of which portability is required, such as a portable personal computer, mobile phone or digital camera, and so forth.

Further, the memory card is made up primarily of a substrate with a semiconductor memory chip ((hereinafter referred to merely as a semiconductor chip) mounted thereon, and a cap (case body) covering the semiconductor chip, being of a thin card type, so that as a constituent material of the cap, use is often made of a resin material relatively high in strength, and capable of preventing deformation.

Meanwhile, the memory card is used by inserting the same into a connector of the above-described equipment, and insertion and extraction of the same is repeated in its application condition. In that case, because an edge of the memory card is caused to rub against the connector, resin on the part of the connector is caused to undergo wear and tear if a hard resin material is used for the cap. Accordingly, as the constituent material of the cap, use should be made of a soft resin having elasticity while maintaining strength (hardness) to some extent.

The inventor, et al. have found out the following problems with a thin type memory card, requiring use of a relatively soft resin as a constituent material of a cap.

There occurs a problem in that as product information in the form of an ink mark is printed on a surface of the cap, marking defects due to ink bleed occurs, thereby causing a process yield of the memory card to deteriorate.

There occurs a problem of considerable deterioration in production efficiency due to deterioration of the process yield in addition to the need for an ink marking process step.

Incidentally, in Patent Document 1 (Japanese Unexamined Patent Publication No. 2000-326668), there has been found no description at all on the thin type memory card, requiring use of the relatively soft resin as the constituent material of the cap for carrying out insertion and extraction of the memory card against the connector.

It is therefore an object of the invention to provide a technology capable of enhancing a process yield.

Further, another object of the invention is to provide a technology capable of reducing man-hour.

The above and other objects and novel features of the invention will more fully appear from the following detailed description when the same is read in connection with the accompanying drawings.

The essence of a representative embodiment of the invention disclosed under the present application is simply described as follows.

Now, according to one aspect of the invention, there is provided a semiconductor device comprising a substrate having a component mount face with semiconductor chips mounted thereon, the substrate being provided with a plurality of external terminals, and a case body made of resin, placed over the component mount face of the substrate so as to cover the same, the case body having a first body part, and a second body part larger in thickness than the first body part, wherein product information in the form of inscriptions is engraved on the second body part of the case body.

Further, according to another aspect of the invention, there is provided a semiconductor device comprising a substrate having a component mount face with semiconductor chips mounted thereon, and a back surface opposite to the component mount face, the substrate being provided with a plurality of external terminals, a first case body made of resin placed over the component mount face of the substrate so as to cover the same, and a second case body made of resin placed over the back surface so as to cover the same, and bonded to the first case body, wherein at least one of the first case body and the second case body is provided with a first body part and a second body part larger in thickness than the first body part, and product information is engraved on the second body part.

Still further, according to still another aspect of the invention, there is provided a semiconductor device comprising a substrate having a component mount face with semiconductor chips mounted thereon, and a back surface opposite to the component mount face, an insulating film being formed on the back surface, the substrate being provided with a plurality of external terminals, and a case body made of resin placed over the component mount face of the substrate so as to cover the same, wherein a coating film is formed on portions of the insulating film over the back surface of the substrate, excluding portions thereof corresponding to letter portions displaying product information, and the product information is displayed by means of color tone difference between the insulating film, and the coating film.

Yet further, according to a further aspect of the invention, there is provided a method for manufacturing a semiconductor device, comprising the steps of: preparing a case body made of resin having a first body part and a second body part larger in thickness than the first body part, in which common information common to a plurality of customers among product information is engraved in the second body part; placing the case body over a substrate so as to cover a component mount face of the substrate with the first body part to thereby bond the case body to the substrate; and displaying customer information other than the common information among product information, in the case body by means of a print or a seal.

Now, advantageous effects obtained by a representative one of the embodiments of the invention disclosed under the present application are summed up as follows.

With the semiconductor device (memory card), the product information is engraved on the second body part (a thick part) that is larger in thickness than the first body part of the case body, so that it is possible to prevent occurrence of marking defects due to ink bleed, and so forth, thereby enhancing the process yield of the semiconductor device. Furthermore, since the product information is engraved, it is possible to eliminate an ink-marking process step, so that a manufacturing process in back-end process steps for assembling the semiconductor device can be simplified. As a result, it is possible to improve throughput of a process for assembling the semiconductor device.

DETAILED DESCRIPTION OF THE PREFERRED EMBODIMENTS

With embodiments of the invention, described hereinafter, repeated description of identical or similar parts of the embodiments is, in principle, omitted unless there is a particular need for description.

Further, the embodiments of the invention, described hereinafter, will be divided into a plurality of sections or embodiments before description if necessary for the sake of convenience, however, it is to be understood that those are not unrelated to each other unless explicitly described otherwise, but one of those is associated with variations, detail, supplementary description, and so forth of part or the whole of the other.

Still further, with the embodiments of the invention, described hereinafter, in the case where the number, and so forth of elements (including the number of pieces, numerical values, quantity, scope, and so forth) are referred to, it is to be understood that the invention is not limited to a specified number unless explicitly described otherwise, or unless the invention is obviously limited to a specified number on the basis of the principle underlying the invention, so that the number may be more than, or less than the specified number.

Now, the embodiments of the invention are described in detail hereinafter with reference to the accompanying drawings. In all the drawings used in describing the embodiments of the invention, constituent members each having an identical function are denoted by like reference numerals, thereby omitting repeated description thereof.

Embodiment 1

Figure 1:
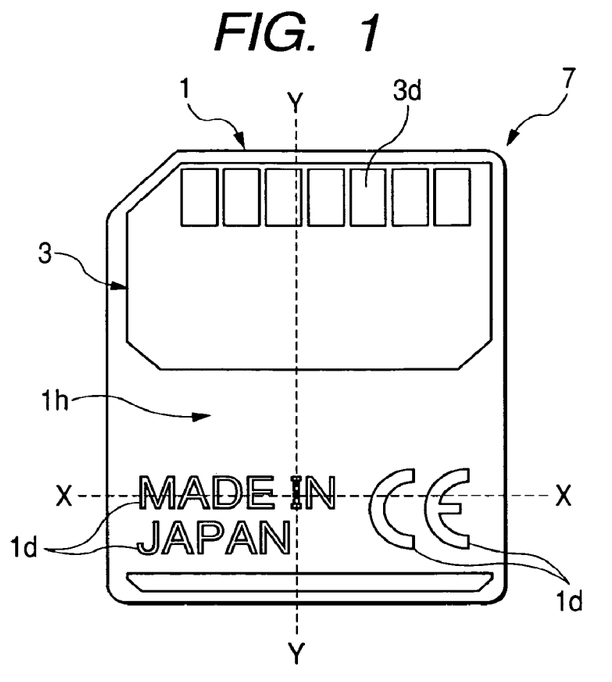
FIG. 1 is a plan view showing an example of a top surface structure of Embodiment 1 of a semiconductor device according to the invention.
Figure 2:
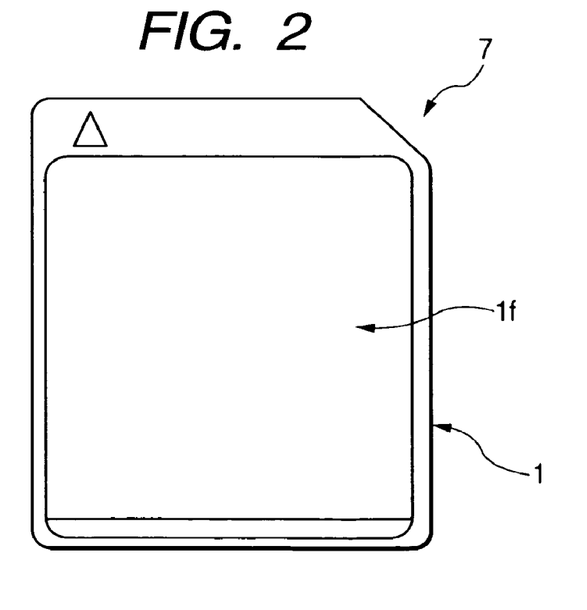
FIG. 2 is a back surface view showing an example of a back surface structure of the semiconductor device shown in FIG. 1.
Figure 3:
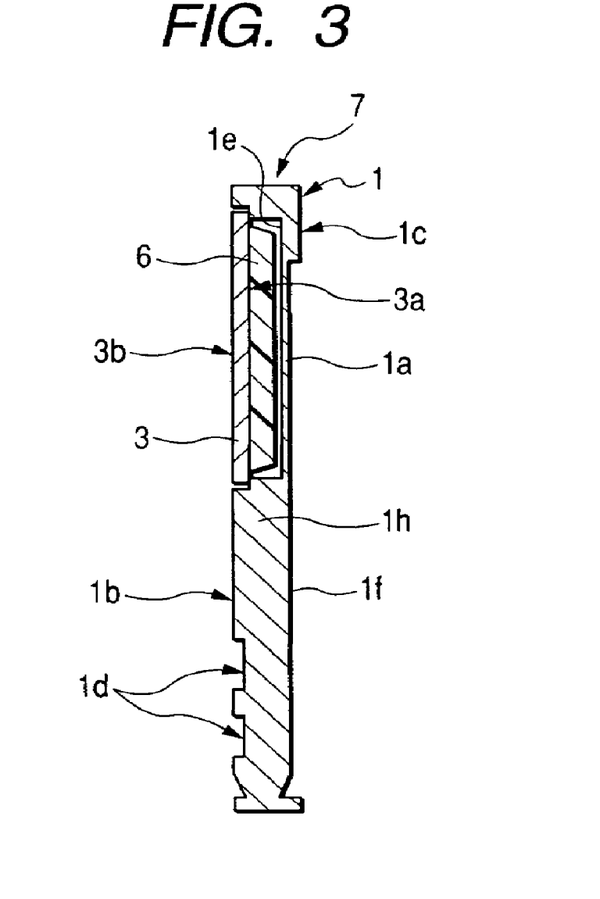
FIG. 3 is a sectional view showing the structure cut along line Y-Y in FIG. 1.
Figure 4:
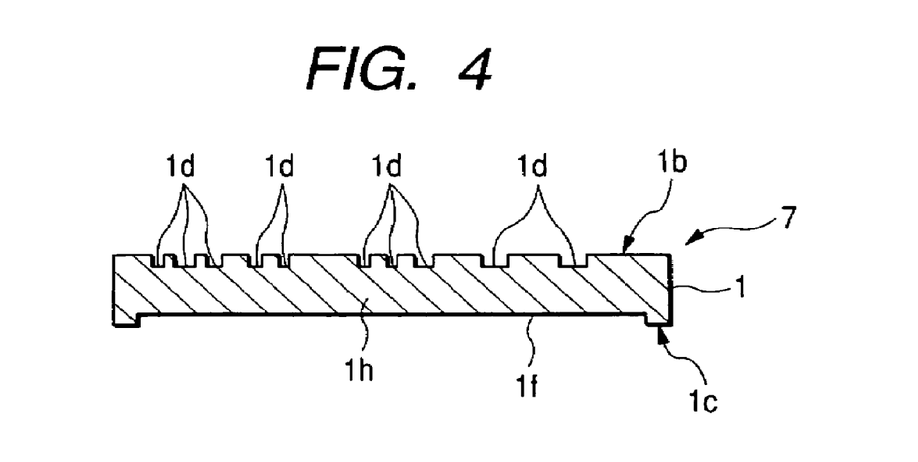
FIG. 4 is a sectional view showing the structure cut along line X-X in FIG. 1.
Figure 5:
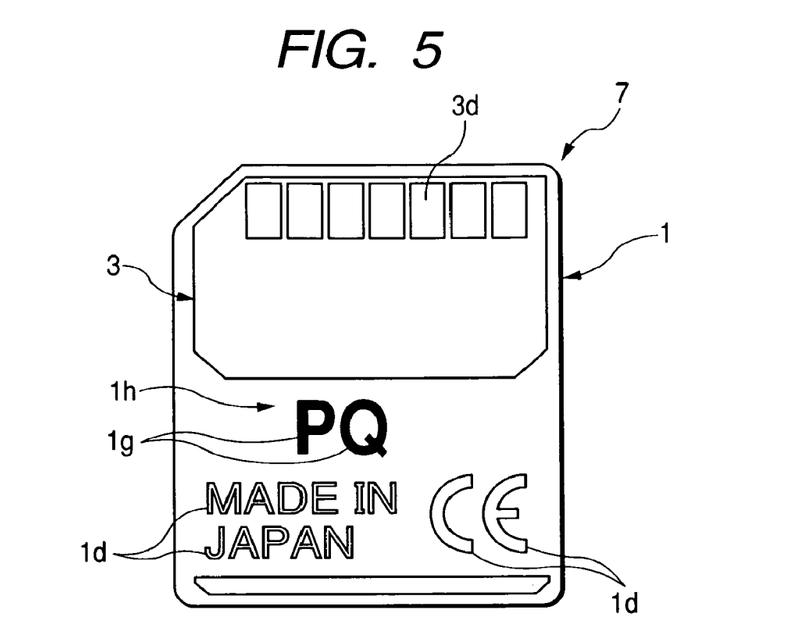
FIG. 5 is a plan view showing a top surface structure of a semiconductor device according to a variation of Embodiment 1 of the invention.
Figure 6:
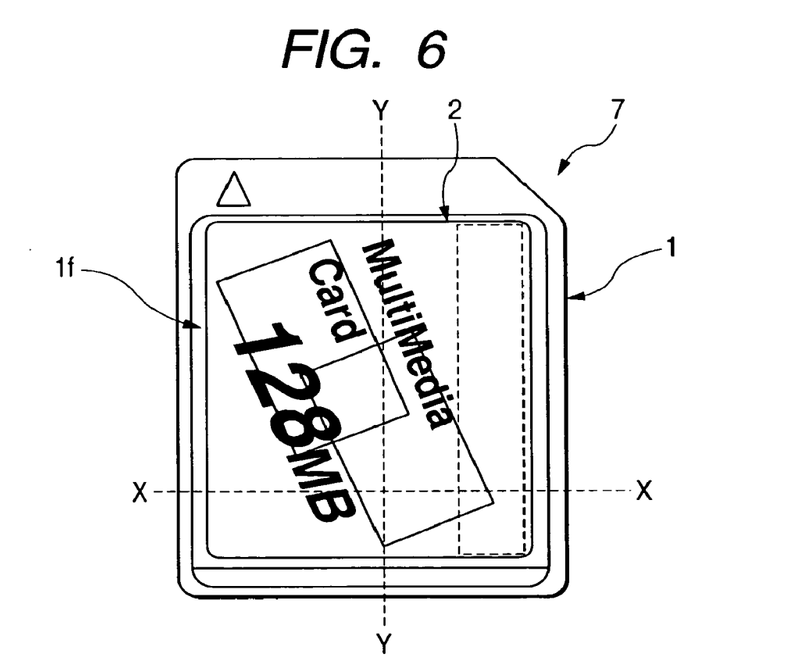
FIG. 6 is a back surface view showing an example of a structure in which a seal is stuck to the back surface of the semiconductor device shown in FIG. 1.
Figure 7:
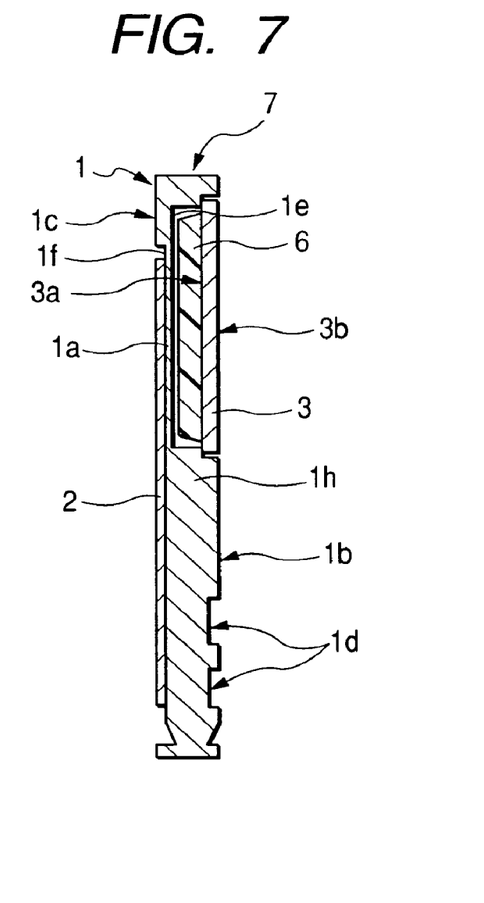
FIG. 7 is a sectional view showing the structure cut along line Y-Y in FIG. 6.
Figure 8:
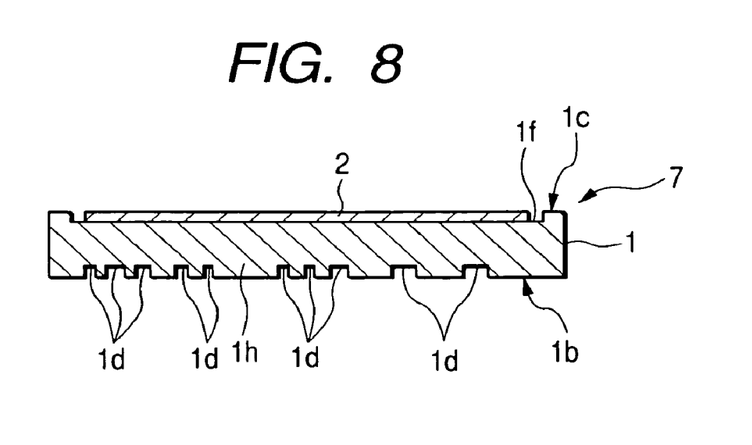
FIG. 8 is a sectional view showing the structure cut along line X-X in FIG. 6.
Figure 9:
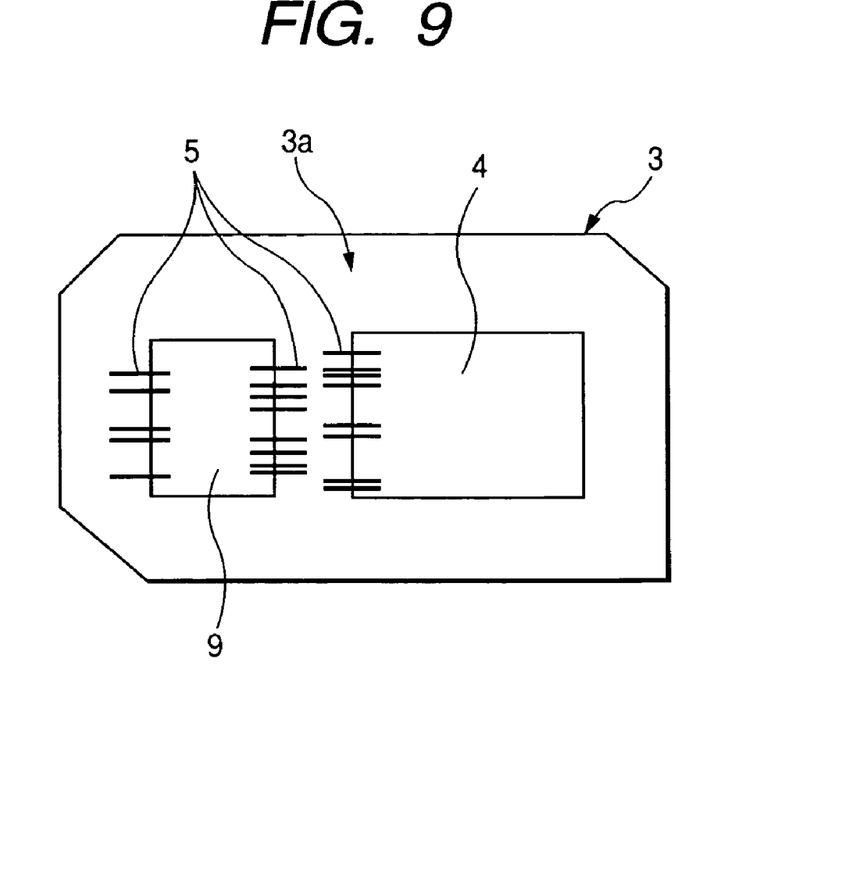
FIG. 9 is a plan view showing an example of chip layout over a substrate of the semiconductor device shown in FIG. 1.
Figure 10:
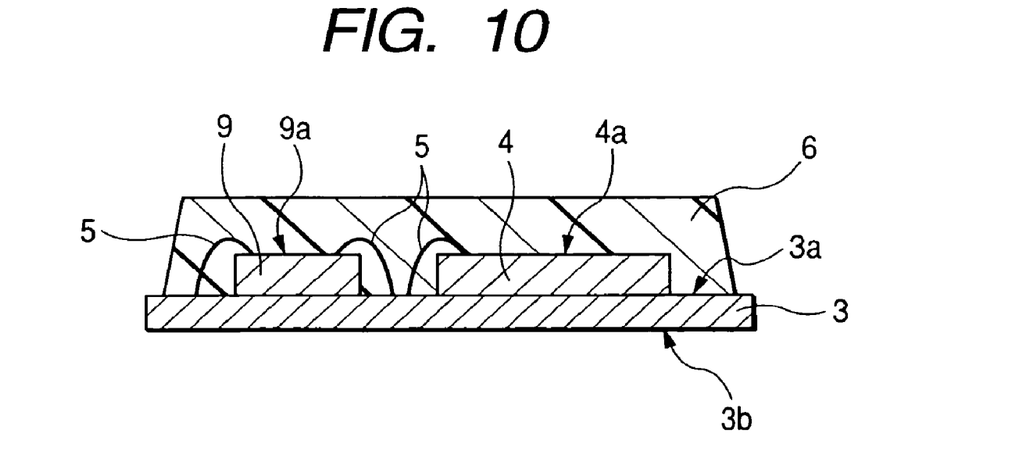
FIG. 10 is a sectional view showing an example of an internal structure of the semiconductor device shown in FIG. 1, with the substrate and a sealing body assembled therein.
Figure 11:
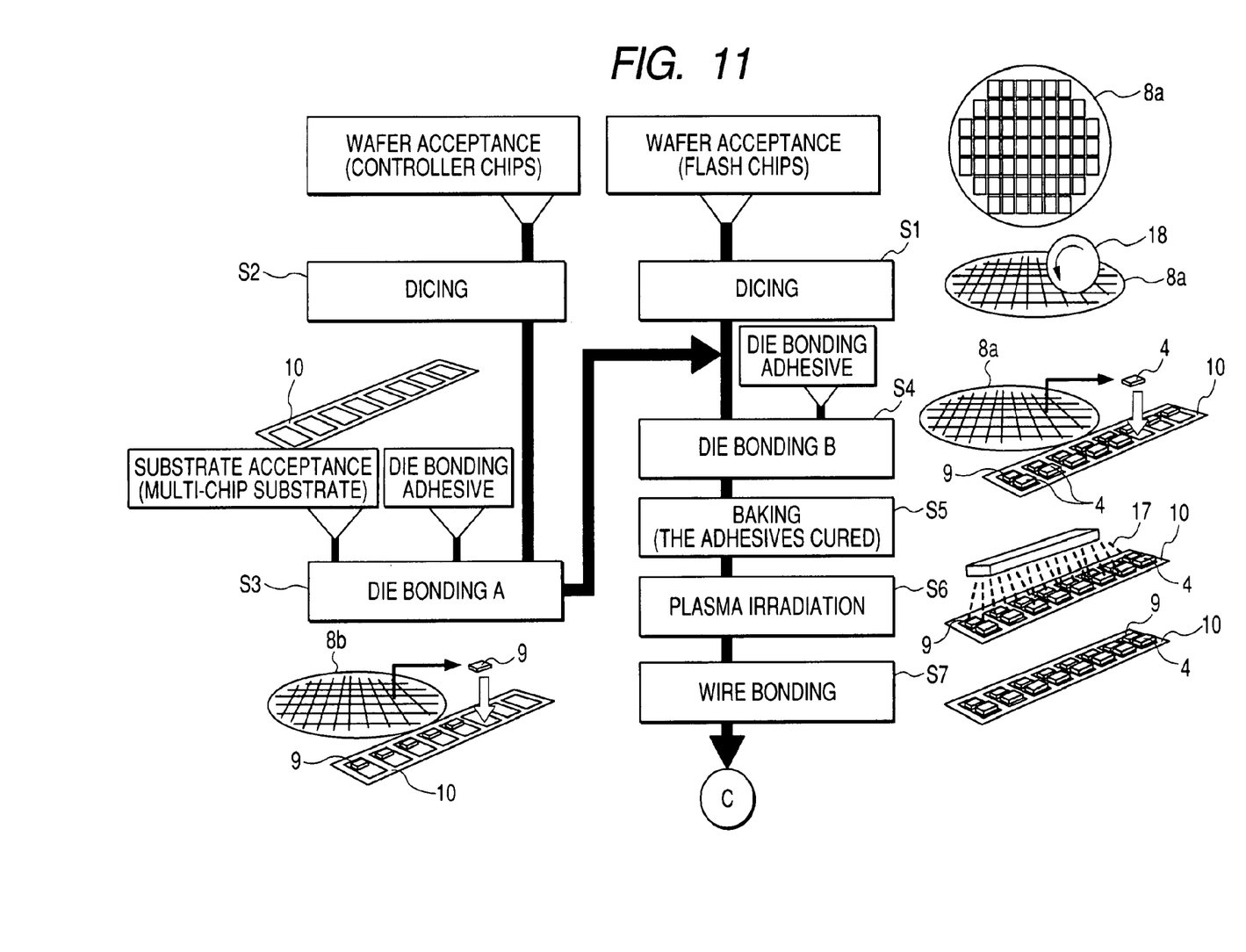
FIG. 11 is a process flow chart showing an example of an assembling procedure for assembling the semiconductor device according to Embodiment 1 of the invention up to the step of wire bonding.
Figure 12:
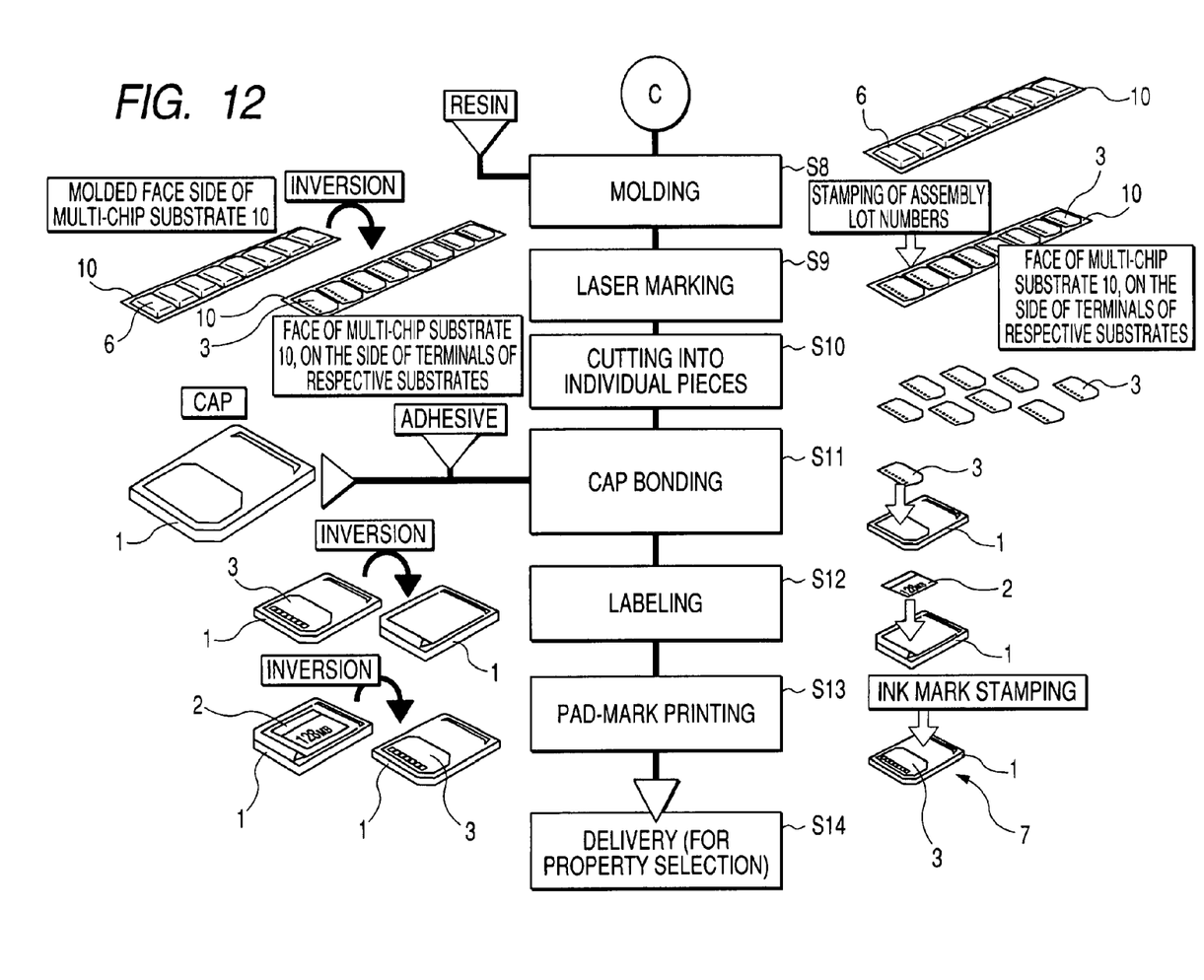
FIG. 12 is a process flow chart showing an example of the assembling procedure for assembling the semiconductor device according to Embodiment 1 of the invention after the step of the wire bonding.
Figure 13:
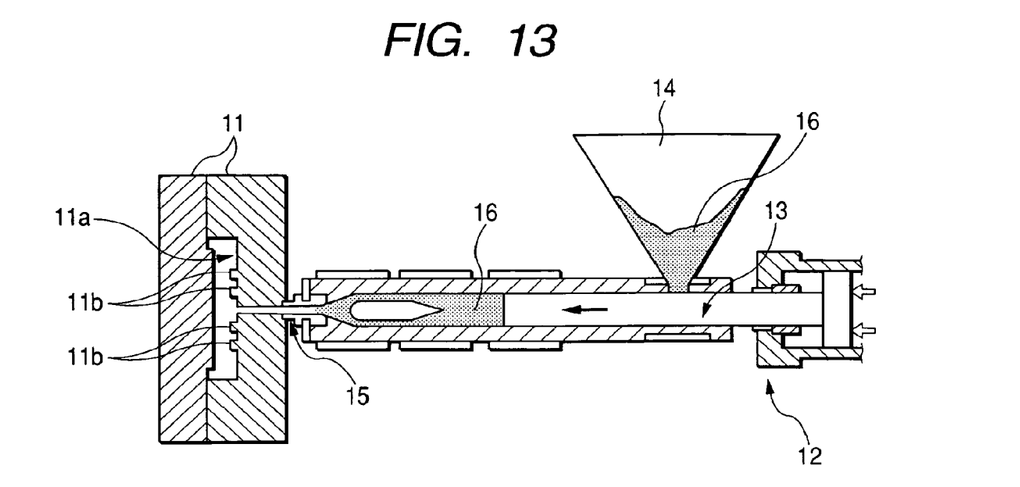
FIG. 13 is a sectional view showing a principle on which injection molding is carried out at the time of forming a cap (case body) of the semiconductor device shown in FIG. 1 by way of example.

FIG. 1 is a plan view showing an example of a top surface structure of Embodiment 1 of a semiconductor device according to the invention, FIG. 2 a back surface view showing an example of a back surface structure of the semiconductor device shown in FIG. 1, FIG. 3 a sectional view showing the structure cut along line Y-Y in FIG. 1, FIG. 4 a sectional view showing the structure cut along line X-X in FIG. 1, FIG. 5 a plan view showing a top surface structure of a semiconductor device according to a variation of Embodiment 1 of the invention, FIG. 6 a back surface view showing an example of a structure in which a seal is stuck to the back surface of the semiconductor device shown in FIG. 1, FIG. 7 a sectional view showing the structure cut along line Y-Y in FIG. 6, FIG. 8 a sectional view showing the structure cut along line X-X in FIG. 6, FIG. 9 a plan view showing an example of chip layout over a substrate of the semiconductor device shown in FIG. 1, FIG. 10 a sectional view showing an example of an internal structure of the semiconductor device shown in FIG. 1, with the substrate and a sealing body assembled therein, FIG. 11 a process flow chart showing an example of an assembling procedure for assembling the semiconductor device according to Embodiment 1 of the invention up to the step of wire bonding, FIG. 12 a process flow chart showing an example of the assembling procedure for assembling the semiconductor device according to Embodiment 1 of the invention after the step of the wire bonding, and FIG. 13 a sectional view showing a principle on which injection molding is carried out at the time of forming a cap (case body) of the semiconductor device shown in FIG. 1 by way of example.

The semiconductor device according to Embodiment 1, shown in FIGS. 1 to 4, is a memory card 7 that is usable as an auxiliary storage of electronic equipment such as, for example, information equipment, or communication equipment. The memory card 7 is made up of a small thin sheet, for example, rectangular in plane shape, and is, for example, on the order of 1.5 mm in total thickness. The memory card 7 according to Embodiment 1 is, for example, the so-called multimedia card, however, the memory card 7 is not limited to the multimedia card.

To describe a configuration of the memory card 7 shown in FIGS. 1 to 4, the memory card 7 comprises a substrate 3 having semiconductor chips 4, 9, each with a semiconductor circuit formed thereon, as shown in FIG. 9, and a component mount face 3a with the semiconductor chips 4, 9, mounted thereon, the substrate 3 being further provided with a plurality of connection leads (external terminals) 3d, and a cap (case body) 1 made of resin, placed over the component mount face 3a of the substrate 3 so as to cover the same, as shown in FIG. 3, the cap 1 having a first body part 1a, and a second body part 1h larger in thickness than the first body part 1a, and product information in the form of inscriptions 1d is engraved on a side of the second body part 1h, adjacent to the top surface 1b thereof, as shown in FIGS. 1, 3, and 4.

Further, the product information is divided primarily into common information common to a plurality of customers, and customer information that is information unique to individual customers. The common information includes, for example, standard specification names, names of country of manufacture, and so forth. On the other hand, the customer information includes, for example, customer names (maker names), capacities, or product numbers, and so forth. Further, any of a letter, number, mark, symbol, pattern, and so forth may be adopted as a display form of the product information.

With the memory card 7 shown in FIG. 1, only the common information among the product information, in the form of the inscriptions id, is engraved on the top surface 1b of the cap 1. That is, "MADE IN JAPAN" (the name of country of manufacture), and "CE" (the standard specification name) are shown by means of the inscriptions 1d. Herein, "CE" is concerned with, for example, safety and health as decided by European Union (EU), representing a mark inscribed on a product meeting the standard (safety) specification.

Further, both the common information and the customer information may be shown by means of the inscriptions 1d only.

The memory card 7 according to Embodiment 1 represents a case where the substrate 3 with the semiconductor chips 4, 9 mounted thereon is sufficiently small in size in comparison with the cap 1 covering a sealing body 6 over the substrate 3, and consequently, the inscriptions 1d are provided in a sufficiently thick part (the second body part 1h) of the cap 1, where the substrate 3 is not disposed.

With the memory card 7 shown in FIG. 1, the size of the substrate 3 corresponds to approximately one half of the size of the cap 1. It therefore follows that with the memory card 7 according to Embodiment 1, as shown in FIG. 3, the cap 1 has the first body part 1a that is a thinner part having a cavity 1e where the substrate 3 with the semiconductor chips 4, 9 mounted thereon is disposed, and the second body part 1h larger in thickness than the first body part 1a, and the inscriptions id are engraved on the top surface 1b of the second body part 1h (the thick part of the cap) that is a part of the cap, larger in thickness.

That is, because the memory card 7 is of a thin card type on the order of, for example, 1.5 mm in total thickness, there is the need for forming the cap 1 out of resin of a relatively high strength, thereby preventing deformation of the memory card 7 itself. However, since the memory card 7 is also used by repeatedly inserting the same into, and extracting the same from a connector, it is necessary to prevent wear and tear of resin on the side of the connector, so that for the constituent material of the cap, use should be made of a resin having flexibility against bending, and elasticity while maintaining a degree of strength (hardness).

The cavity 1e of the cap 1 is on the order of, for example, 1.1 mm in depth, and further, a depression 1f on the order of about 0.1 mm in depth, for sticking a seal 2 about 80 μm thick as shown in FIG. 6 thereto is formed on the back surface 1c of the cap 1, as shown in FIGS. 2, and 3. Consequently, the first body part 1a of the cap 1 becomes about 0.3 mm in thickness (excluding the thickness of the seal). In this case, the memory card 7 is not allowed to increase total thickness thereof (to exceed the maximum value of the total thickness, as specified), so that the inscriptions 1d are formed so as to be recessed in the form of intaglio letters because the inscriptions 1d are not allowed to be in the form of relief letters. In this case, the inscriptions id each have a recess, for example, about 0.1 mm in depth, and if the first body part 1a of the cap 1, about 0.3 mm thick, is recessed by about 0.1 mm in order to engrave the inscriptions 1d thereon, this will cause the strength of the cap 1 to be considerably reduced, so that it is difficult to engrave the inscriptions 1d in the first body part 1a.

Accordingly, with the memory card 7 according to Embodiment 1, by engraving the product information in the form of inscriptions 1d on the second body part 1h that is the thick part of the cap, sufficiently thicker than the first body part 1a, thinner than the former, the product information can be displayed without the use of an ink mark, so that it is possible to prevent occurrence of marking defects due to ink bleed, and so forth, thereby enhancing a process yield of the memory card 7.

The cap 1 is formed by injection molding. FIG. 13 shows a principle on which the injection molding is carried out, representing a molding method comprising the steps of sending a molding resin 16 inside a hopper 14 into a cylinder 12 as heated by reciprocating motion of an injection ram 13, heating and fluidizing the molding resin 16 in the cylinder 12, and squeezing the molding resin 16 into a mold 11 by use of the injection ram 13. Then, the molding resin 16 as fluidized is injected through a nozzle 15 provided at one end of the cylinder 12 to enter a cavity 11a of the mold 11 from a pouring gate of the mold 11 via a runner thereof.

With the memory card 7 according to Embodiment 1, protrusions 11b corresponding to a form of the product information are formed on a face defining the cavity 11a of the mold 11, so that the inscriptions id can be formed by means of the protrusions 11b concurrently at the time of the injection molding.

In other words, the inscriptions 1d are engraved concurrently when the cap 1 is formed by the injection molding.

Further, a thermoplastic resin is preferably used for the constituent material of the cap 1. The thermoplastic resin is solidified quick, and at room temperature. Accordingly, since the thermoplastic resin is cured at the time of release from the mold, the same is suited for use in the injection molding.

Furthermore, as temperature rises to some extent, so the resin is softened, thereby enabling the resin to be reused in recycling.

Further, as shown in FIGS. 9, and 10, the two semiconductor chips 4, 9, are mounted in the memory card 7 according to Embodiment 1, and both the chips are bonded to the component mount face 3a of the substrate 3. And respective electrodes formed on the top surfaces 4a, 9a of both the chips, respectively, are electrically connected with the substrate 3 through the intermediary of wires 5 such as gold wires, and so forth, respectively.

Further, the semiconductor chip 4 is a memory chip having a memory circuit, such as, for example, a flash memory (non-volatile memory), and so forth, while the semiconductor chip 9 is, for example, a controller chip having a controller circuit. Accordingly, operation of the semiconductor chip 4 that is the memory chip is controlled by the semiconductor chip 9 that is the controller chip.

Further, as shown in FIG. 10, the semiconductor chips 4, 9 are resin-encapsulated with a sealing body 6 over the substrate 3. In this case, the sealing body 6 is formed of an epoxy-based thermosetting resin.

Further, the plurality of the connection leads 3d serving as the external terminals of the memory card 7, respectively, are formed along one end of the back surface 3b of the substrate 3 in such a way as to be aligned in a row as shown in FIG. 1. Accordingly, when the substrate 3 with the sealing body 6 formed thereon is disposed in the cavity 1e of the cap 1, the substrate 3 is disposed in the cavity 1e such that the cavity 1e covers the surface of the sealing body 6, and the back surface 3b of the substrate 3 is caused to face outward. In such a state as described, the cap 1 is bonded to the substrate 3 with a binder, thereby forming a structure where the plurality of the connection leads 3d are formed along one end of the top surface 1b of the memory card 7.

Now, there is described hereinafter a memory card 7 according to a variation of Embodiment 1.

In the case of the memory card 7 according to a variation shown in FIG. 5, inscriptions 1d in combination with a print 1g are used to display the product information. For example, the common information (MADE IN JAPAN and the standard specification names such as CE and so forth) common to the plurality of the customers, among the product information, is displayed with the inscriptions 1d engraved on the top surface 1b of a second body part 1h of a cap 1 while the customer information (for example, maker names such as PQ, and so forth) unique to the individual customers is displayed with the print 1g provided similarly in the second body part 1h of the cap 1.

Thus, with the use of the inscriptions 1d in combination with the print 1g for displaying the product information, it becomes possible to reduce a printing portion by virtue of the inscriptions 1d as compared with the conventional display method depending solely on printing, so that there will be smaller potentiality of occurrence of defects, thereby enabling the process yield of the memory card 7 to be enhanced.

Further, in the case of a memory card 7 according to a variation shown in FIGS. 6 to 8, a seal 2 for displaying the customer information such as card names, capacities, and so forth, among the product information, is stuck to the depression 1f formed on the back surface 1c of the cap 1. In this case, the seal 2 is stuck to a region of the back surface 1c of the cap 1, ranging from the first body part 1a to the second body part 1h.

More specifically, since the inscriptions 1d cannot be formed in the first body part 1a smaller in thickness, but the seal 2 can be stuck even to the first body part 1a, it is quite effective to display the common information by means of the inscriptions 1d formed in the second body part 1h, and to stick the seal 2 displaying the customer information to the region of the back surface 1c of the cap 1, including the first body part 1a where the inscriptions 1d cannot be formed.

As shown in FIG. 5, and FIGS. 6 to 8, by displaying only the common information among the product information by means of the inscriptions 1d formed in the second body part 1h that is a part of the cap 1, larger in thickness, while the print 1g or the seal 2 is adopted for displaying the customer information other than the common information on the cap 1, freedom in displaying the customer information will increase, so that a memory card 7 with only the common information inscribed thereon is enabled to cope with various customers.

Now, there is described a method of manufacturing the semiconductor device (memory card) according to Embodiment 1 with reference to FIGS. 11, and 12.

There is described herein the case where the inscriptions 1d in combination with the print 1g are used, and the seal 2 is stuck to the back surface 1c of the cap 1, for displaying the product information of the memory card 7.

As shown in FIG. 11, a semiconductor wafer 8a for acquiring the semiconductor chips 4 for the memory chips (flash chips) is first prepared by wafer acceptance, and subsequently, the semiconductor wafer 8a is turned into chips by dicing as shown in step S1. In this case, the dicing is executed by use of a blade 18.

Meanwhile, a semiconductor wafer 8b for acquiring the semiconductor chips 9 for the controller chips is prepared by wafer acceptance, and subsequently, the semiconductor wafer 8b is turned into chips by dicing as shown in step S2.

Thereafter, substrate acceptance for accepting a multi-chip substrate 10 is executed to be followed by die-bonding A shown in step S3. In step S3, the semiconductor chips 9 are taken out of the semiconductor wafer 8b for acquiring the controller chips to be then fixed to the multi-chip substrate 10 through the intermediary of a die bonding adhesive (die bonding agent).

Die bonding B shown in step S4 is executed after execution of the die-bonding A. In step S4, the semiconductor chips 4 are taken out of the semiconductor wafer 8a for acquiring the memory chips to be then fixed to the multi-chip substrate 10 through the intermediary of a die bonding adhesive.

Thereafter, baking shown in step S5 is executed to cure the die bonding adhesive.

Subsequently, plasma irradiation shown in step S6 is executed. In step S6, electrodes over the multi-chip substrate 10 are irradiated with plasma 17 to cause respective surfaces of the electrodes to be activated, thereby keeping bonding strength between the electrodes and the wires 5 (gold wires) shown in FIG. 9, respectively, enhanced.

After the plasma irradiation, wire bonding shown in step S7 is executed. In step S7, respective electrodes of the semiconductor chips 4 as well as the semiconductor chips 9 are electrically connected to the respective electrodes over the multi-chip substrate 10, corresponding to the former, via the wires 5.

Thereafter, as shown in FIG. 12, molding that is resin-encapsulation shown in step S8 is executed. In step S8, the sealing bodies 6 are formed over the multi-chip substrate 10 by use of a sealing resin to thereby resin-encapsulate the semiconductor chips 4 as well as the semiconductor chips 9, together with a plurality of the wires 5.

The molded face side of the multi-chip substrate 10 is inverted after the molding to thereby cause a face thereof, on the side of the terminals (the connection leads 3d) of the respective substrates 3 to face upward, and in such a state as described, laser marking shown in step S9 is executed. In this case, assembly lot numbers are stamped on the periphery of the face of the multi-chip substrate 10, on the side of the terminals of the respective substrates 3, by use of a laser.

Thereafter, cutting into individual pieces, as shown in step S10, is executed to thereby cut the multi-chip substrate 10 into individual substrates.

Meanwhile, there is prepared the cap (case body) 1 made of resin, having the first body part 1a and the second body part 1h larger in thickness than the first body part 1a, as shown in FIGS. 1 to 4, with at least the common information, common to the plurality of the customers among the product information in the form of the inscriptions id engraved on the second body part 1h that is the thick part of the cap 1. The cap 1 is formed by a method of, for example, the injection molding as shown in FIG. 13, and is preferably formed of a thermoplastic resin. Further, the common information includes the name of country of manufacture such as "MADE IN JAPAN" etc., and the standard specification name such as "CE" etc.

Subsequently, cap bonding for bonding the substrate 3 with the sealing body 6 formed thereon to the cap 1 by use of a binder is executed in step S11. In this step, the cap 1 is placed over the substrate 3 in such a way as to cover with the first body part 1a, the component mount face 3a of the substrate 3, the semiconductor chips 4, 9 being mounted thereon, to thereby bond the substrate 3 to the cap 1 with the binder. That is, the substrate 3 is disposed in the cavity 1e such that the cavity 1e covers the surface of the sealing body 6, and the back surface 3b of the substrate 3 is caused to face outward. In such a state as described, the cap 1 is bonded to the substrate 3 with the binder. By so doing, the memory card 7 will be in a state where the plurality of the connection leads 3d are disposed along one end of the top surface 1b of the memory card 7.

Thereafter, the memory card 7 is again inverted to thereby cause the back surface 1c of the cap 1 to face upward, and in such a state as described, labeling shown in step S12 is executed. In this step, the seal 2 for displaying the customer information such as card names, capacities, and so forth, among the product information, is stuck to the depression 1f formed on the back surface 1c of the cap 1.

Subsequently, the memory card 7 is again inverted to thereby cause the top surface 1b of the cap 1 to face upward, and in such a state as described, pad-mark printing shown in step S13 is executed. In this step, ink mark stamping is executed on the top surface 1b of the second body part 1h of the cap 1, thereby displaying the customer information among the product information, such as customer names (maker names), and so forth, with the print 1g, as shown in FIG. 5.

By so doing, assembling of the memory card 7 is completed, and subsequently, delivery (for property selection) shown in step S14 is executed.

With the semiconductor device (memory card) according to Embodiment 1, and the method of manufacturing the same, since the product information in the form of the inscriptions 1d is engraved on the second body part 1h of the cap 1 (the thicker part of the cap) of the memory card 7, larger in thickness than the first body part 1a, marking defects due to ink bleed and so forth do not occur, so that the process yield of the memory card 7 can be enhanced.

Further, since the product information is displayed with the inscriptions 1d in intaglio letters so as not to allow the total thickness of the memory card 7 to exceed the maximum value of the total thickness, as specified), and inscription spots are located in the thicker part of the cap (the second body part 1h), it is also possible to prevent bending strength of the memory card 7 from falling below a specified value.

More specifically, with the cap 1, the product information in the form of inscriptions 1d is engraved on the second body part 1h thicker than the first body part 1a, so that the cap 1 can maintain strength thereof without lowering the same. As a result, it is possible to prevent the bending strength of the memory card 7 from undergoing deterioration.

Further, since the product information in the form of inscriptions 1d is engraved, it is possible to eliminate an ink-marking process step, so that a manufacturing process in back-end process steps for assembling the memory card 7 can be simplified. As a result, it is possible to improve throughput of a process for assembling the memory card 7.

Still further, as a result of elimination of the ink marking process, it is possible to reduce the man-hour in assembling the memory card 7. Accordingly, a manufacturing cost of the memory card 7 can be reduced.

Yet further, since occurrence of the marking defects due to ink bleed, and so forth can be prevented, external quality of the memory card 7 can be enhanced. Furthermore, since the product information in the form of inscriptions 1d is engraved, it is possible to secure dimensional accuracy of the letters for displaying the product information, thereby enhancing the process yield of the memory card 7.

Further, since only the common information common to the plurality of the customers, among the product information, is displayed by means of the inscriptions id in the second body part 1h that is the thick part of the cap while the customer information other than the common information is displayed on the cap 1 with the print 1g or the seal 2, freedom in displaying the customer information will increase, so that the memory card 7 with only the common information as engraved is enabled to cope with various customers. It therefore follows that the memory card 7 with only the common information engraved on the cap 1 may be delivered, or the memory card 7 displaying the customer information by means of the print 1g or the seal 2 in addition to the common information in the form of the inscriptions 1d may be delivered Embodiment 2

Figure 14:
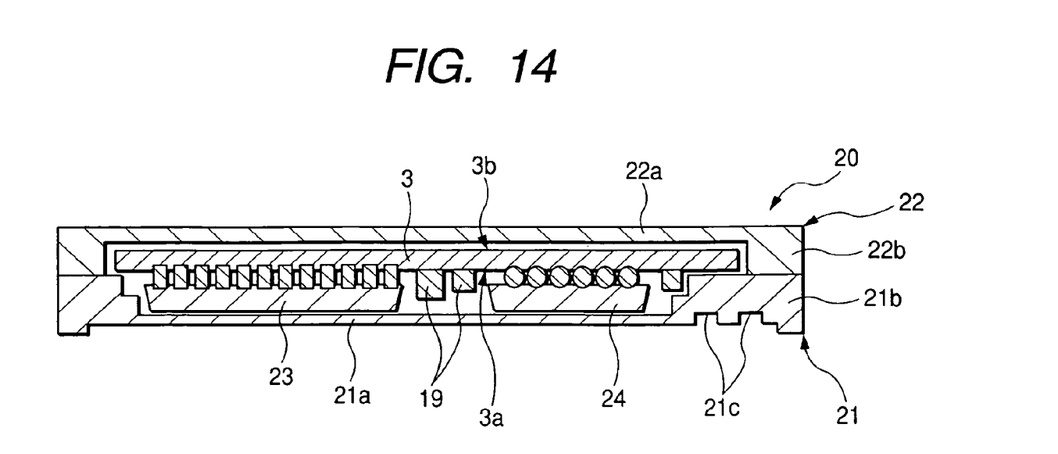
FIG. 14 is a sectional view showing an example of a structure of Embodiment 2 of a semiconductor device according to the invention.

FIG. 14 is a sectional view showing an example of a structure of Embodiment 2 of a semiconductor device according to the invention.

The semiconductor device according to Embodiment 2 is a memory card 20 having the same function as that of the memory card 7 according to Embodiment 1, however, the memory card 20 is of a double-faced case structure where a case body covering a substrate 3 and IC packages 23, 24 mounted on the substrate 3 is divided into a top surface side portion and a back surface side portion.

More specifically, the memory card 20 has a top surface side cap (a first case body) 21 made of resin, placed over a component mount face 3a of the substrate 3, and the IC packages 23, 24 in such a way as to cover those, and a back surface side cap (a second case body) 22 made of resin, placed over the back surface 3b of the substrate 3 in such a way as to cover the same, and bonded to the top surface side cap 21, and further, at least one of the top surface side cap 21, and the back surface side cap 22 has a cap portion large in section thickness, the product information in the form of inscriptions 21c being displayed in intaglio letters in the cap portion large in section thickness. For example with the memory card 20 shown in FIG. 14, the top surface side cap 21 has a first body part 21a, and a second body part 21b larger in thickness than the first body part 21a, and further, the back surface side cap 22 also has a first body part 22a, and a second body part 22b larger in thickness than the first body part 22a, however, because the top surface side cap 21 has an area sufficient for forming the inscriptions 21c, the product information in the form of the inscriptions 21c is engraved on the top surface side cap 21 only. However, if it is possible to engrave the inscriptions 21c on the second body part 22b of the back surface side cap 22, the inscriptions 21c may be engraved on the back surface side cap 22.

Further, the IC package 23 with a memory chip assembled therein, and the IC package 24 with a controller chip assembled therein are mounted on the substrate 3 of the memory card 20 according to Embodiment 2, and chip components, such as chip capacitors 19, and so forth are also mounted on the substrate 3.

The memory card 20 according to Embodiment 2 is of the double-faced case structure, and is called, for example, the SD card, however, the memory card 20 is not to be limited to the SD card.

Further, as with the memory card 7 according to Embodiment 1, the top surface side cap 21 as well as the back surface side cap 22 is preferably formed of a thermoplastic resin. Further, the customer information among the product information may be displayed by a print or seal provided on at least one of the top surface side cap 21 and the back surface side cap 22 in addition to the inscriptions 21c.

With the memory card 20 according to Embodiment 2 as well, the product information in the form of inscriptions 21c is engraved as with the case of the memory card 7 according to Embodiment 1, so that it is possible to prevent occurrence of marking defects due to ink bleed, and so forth, thereby enhancing a process yield of the memory card 20.

Furthermore, other aspects of the structure of the memory card 20, and other advantageous effects obtained by the memory card 20 are the same as those for the memory card 7, omitting therefore duplication in description.

Embodiment 3

Figure 15:
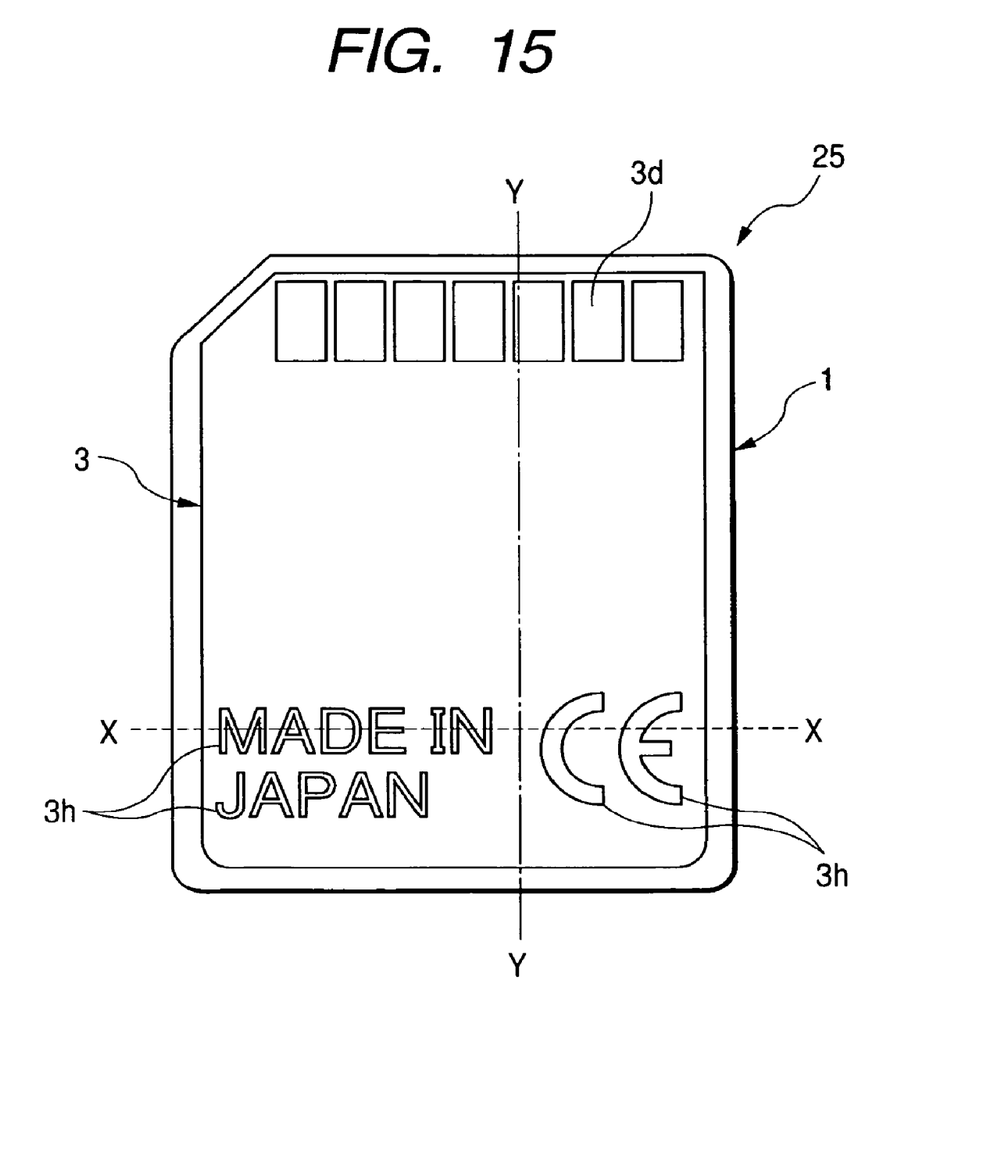
FIG. 15 is a plan view showing an example of a top surface structure of Embodiment 3 of a semiconductor device according to the invention.
Figure 16:
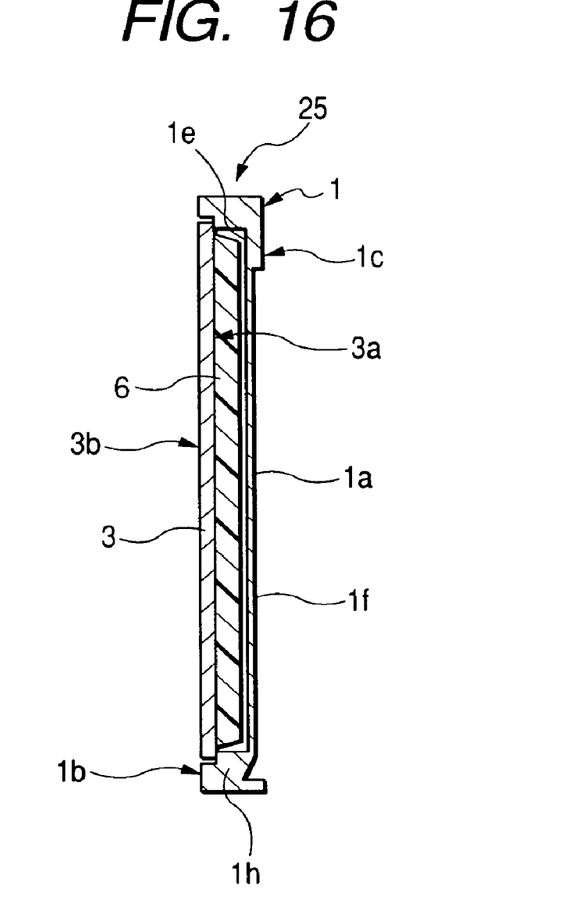
FIG. 16 is a sectional view showing the structure cut along line Y-Y shown in FIG. 15.
Figure 17:
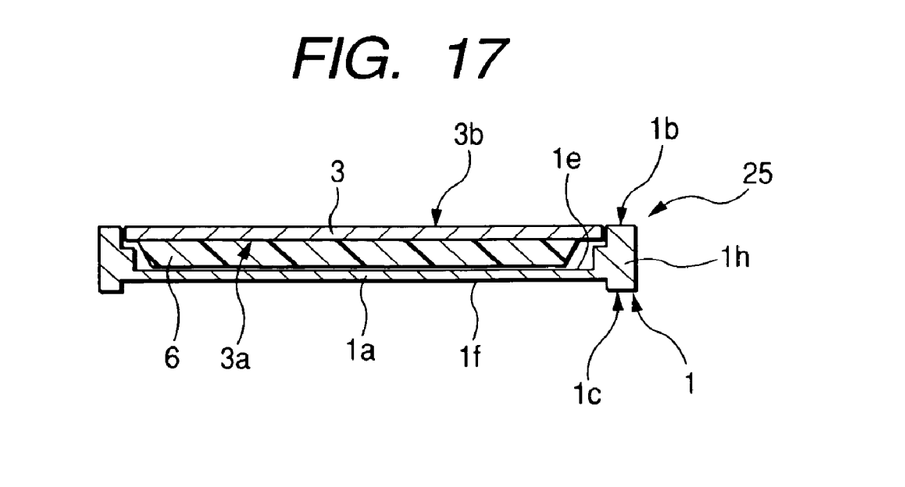
FIG. 17 is a sectional view showing the structure cut along line X-X shown in FIG. 15.
Figure 18:
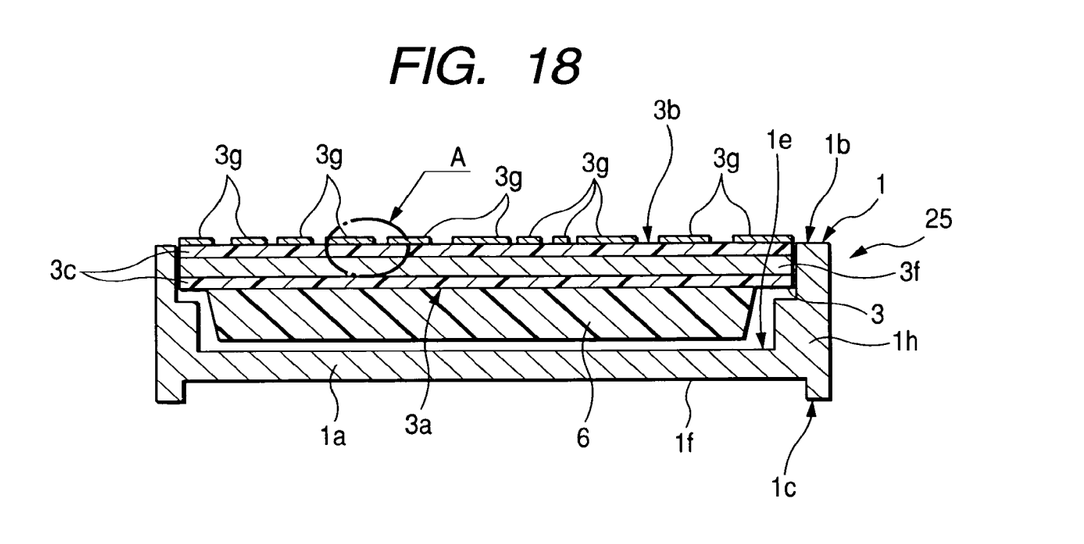
FIG. 18 is a sectional view showing in detail an example of a substrate part structure of the structure shown in FIG. 17.
Figure 19:
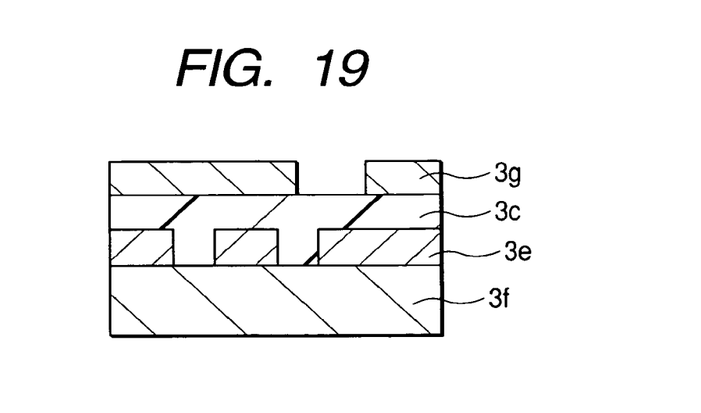
FIG. 19 is a partially enlarged sectional view showing an expanded structure of part A shown in FIG. 18.

FIG. 15 is a plan view showing an example of a top surface structure of Embodiment 3 of a semiconductor device according to the invention, FIG. 16 a sectional view showing the structure cut along line Y-Y in FIG. 15, FIG. 17 a sectional view showing the structure cut along line X-X in FIG. 15, FIG. 18 a sectional view showing in detail an example of a substrate part structure of the structure shown in FIG. 17, and FIG. 19 a partially enlarged sectional view showing an expanded structure of part A in FIG. 18.

The semiconductor device according to Embodiment 3 is a memory card 25 where a size of a substrate 3 is substantially the same as that of a cap 1. Thus, in the case where the substrate 3 is substantially the same in size as the cap 1, it is difficult to form letters for displaying the product information by means of the inscriptions 1d as shown in FIG. 1 on the cap 1, so that with the memory card 25 according to Embodiment 3, the product information is shown by means of color tone difference between an insulating film formed on a side of the substrate 3 adjacent to the back surface 3b thereof, and a coating film formed in an upper layer over the insulating film.

As shown in FIGS. 18, and 19, metal interconnects 3e made up of a copper foil, or the like are formed on a backing 3f of the substrate 3, and a resist film 3c that is the insulating film as well as a protection film is formed in an upper layer over the metal interconnects 3e. The resist film 3c is, for example, green in color. With the memory card 25 according to Embodiment 3, a silk print film 3g that is the coating film as shown in FIG. 19 is further formed in an upper layer over the resist film 3c over the backing 3f.

The silk print film 3g is, for example, black, and so forth, in color, differing from green, and coating is applied thereto in a condition where portions of the silk print film 3g, corresponding to letter portions displaying the product information, remain blank. More specifically, at the time of silk printing in a substrate fabrication stage, the silk printing is applied without inking the portions of the silk print film 3g, corresponding to the letter portions, and the resist film 3c that is the underlying layer of the silk print film 3g is exposed through the portions of the silk print film 3g, not inked, thereby displaying letters by means of color tone difference between black color and green color. By so doing, in the memory card 25, the product information in the form of color tone difference letters 3h is shown as shown in FIG. 15.

With the memory card 25 according to Embodiment 3 as well, the product information in the form of the color tone difference letters 3h is displayed, so that it is possible to prevent occurrence of marking defects due to ink bleed, and so forth, thereby enhancing a process yield of the memory card 25.

Further, other aspects of the structure of the memory card 25, and other advantageous effects obtained by the memory card 25 are the same as those for the memory card 7 according to Embodiment 1, omitting therefore duplication in description.

Having specifically described the invention developed by the inventor, et al. with reference to the embodiments of the invention, it is our intention that the invention be not limited to those embodiments of the invention, as described hereinbefore, and that various changes and modifications may obviously be made in the invention without departing from the spirit and scope thereof.

For example, with Embodiments 1, 2, and 3, description has been given taking the case of the semiconductor device being the memory card as an example, however, if the semiconductor device is of a thin card type for use by inserting the same into, and extracting the same from a connector, the semiconductor device may be of another card type. Further, even if the semiconductor device is the memory card, types of the memory card are not to be limited to the multimedia card, and the SD card, but may be other memory cards.

Thus, the invention is suited for a semiconductor device, and the technology for manufacturing the same.

What is claimed is:

1. A memory card comprising:
a substrate having a front surface and a rear surface opposite to the front surface;
a flash memory chip mounted over the front surface of the substrate;
a controller chip for the flash memory chip mounted over the front surface of the substrate;
a plurality of external terminals arranged over the rear surface of the substrate; and
a sealing body covering the flash memory chip and the controller chip;
wherein a first insulating film is formed over the rear surface of the substrate such that the external terminals are exposed from the first insulating film,
wherein a coating film is formed over the first insulating film such that the external terminals are exposed from the coating film, and wherein product information is arranged at the rear surface of the substrate and in portions where the coating film is not formed as corresponding to the product information of the memory card.

2. A memory card according to claim 1,
wherein the color of the first insulating film is green, and
wherein the color of the coating film is black.

3. A memory card according to claim 1,
wherein the first insulating film is exposed in the portions where the coating film is not formed, and
wherein the product information is shown by means of color tone difference between the first insulating film and the coating film.

4. A memory card according to claim 1,
wherein the product information includes at least one of standard specification names, names of country of manufacture, maker names, capacities of the memory card or product numbers.

5. A memory card according to claim 1,
wherein the memory card is a multimedia card or an SD card.

6. A memory card comprising:
a substrate having a front surface and a rear surface opposite to the front surface;
a flash memory chip mounted over the front surface of the substrate;
a controller chip for the flash memory chip mounted over the front surface of the substrate;
a plurality of external terminals arranged over the rear surface of the substrate; and
a resin covering the flash memory chip and the controller chip;
wherein a resist film is formed over the rear surface of the substrate such that the external terminals are exposed from the resist film,
wherein a silk print film is formed over the resist film such that the external terminals are exposed from the silk print film, and
wherein the silk print film is formed as excluding portions corresponding to letter portions displaying product information of the memory card.

7. A memory card according to claim 6,
wherein the color of the resist film is green, and
wherein the color of the silk print film is black.

8. A memory card according to claim 6,
wherein the resist film is exposed in the portions where the silk print film is excluded, and
wherein the product information is shown by means of color tone difference between the resist film and the silk print film.

9. A memory card according to claim 6,
wherein the product information includes at least one of standard specification names, names of country of manufacture, maker names, capacities of the memory card or product numbers.

10. A memory card according to claim 6,
wherein the memory card is a multimedia card or an SD card.

11. A memory card comprising:
a substrate having a front surface and a rear surface opposite to the front surface;
a flash memory chip mounted over the front surface of the substrate;
a controller chip for the flash memory chip mounted over the front surface of the substrate;
a plurality of external terminals arranged over the rear surface of the substrate; and
a sealing body covering the flash memory chip and the controller chip;
wherein a first film is formed over the rear surface of the substrate such that the external terminals are exposed from the first film,
wherein a second film is formed over the first film such that the external terminals are exposed from the second film,
wherein the second film is formed as excluding portions corresponding to letter portions displaying product information of the memory card,
wherein the first film is exposed in the portions where the second film is excluded, and
wherein the product information is shown by means of color tone difference between the first film and the second print film.

12. A memory card according to claim 11,
wherein the color of the first film is green, and
wherein the color of the second film is black.

13. A memory card according to claim 11,
wherein the product information includes at least one of standard specification names, names of country of manufacture, maker names, capacities of the memory card or product numbers.

14. A memory card according to claim 11,
wherein the memory card is a multimedia card or an SD card.

* * * * *